US012777889B2

(12) United States Patent
Parkhe

(10) Patent No.: US 12,777,889 B2
(45) Date of Patent: Oct. 27, 2026

(54) SUSCEPTOR HEIGHT ADJUSTMENT

(71) Applicant: Applied Materials, Inc., Santa Clara, CA (US)

(72) Inventor: Vijay D. Parkhe, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 421 days.

(21) Appl. No.: 18/236,115

(22) Filed: Aug. 21, 2023

(65) Prior Publication Data

US 2025/0069928 A1 Feb. 27, 2025

(51) Int. Cl.
*H10P 72/76* (2026.01)
*H10P 72/00* (2026.01)
*H10P 72/72* (2026.01)

(52) U.S. Cl.
CPC ........ *H10P 72/722* (2026.01); *H10P 72/0606* (2026.01)

(58) Field of Classification Search
CPC ........... H01L 21/6833; H01L 21/67259; H01L 21/67103; H01L 21/67109; H01L 21/67248; H01L 21/6831
See application file for complete search history.

(56) References Cited

U.S. PATENT DOCUMENTS 5,730,803 A * 3/1998 Steger ................. C23C 16/4586 118/724
7,558,045 B1 * 7/2009 Onate ............... H01L 21/67259 361/234
7,829,871 B2 11/2010 Nakasuji et al.
10,440,777 B2 10/2019 Zhang et al.
10,582,570 B2 3/2020 Parkhe
11,393,710 B2 7/2022 Rice et al.
11,404,249 B2 8/2022 Takahashi et al.
11,626,314 B2 * 4/2023 Ni ..................... H01L 21/68742 414/217
12,100,614 B2 * 9/2024 Srivastava .......... H10P 72/7612
2003/0026904 A1 * 2/2003 Yadav ................. H01L 21/6838 269/21
2004/0179323 A1 * 9/2004 Litman ............... H01L 21/6833 361/234
2004/0223286 A1 * 11/2004 Chu .................... H01L 21/6831 361/234

(Continued)

FOREIGN PATENT DOCUMENTS

CN 215731640 U * 2/2022
JP H10209030 A 8/1998

(Continued)

OTHER PUBLICATIONS

International Search Report and Written Opinion for International Application No. PCT/US2024/010930, mailed May 1, 2024, 11 Pages.

*Primary Examiner* — Yongjia Pan
(74) *Attorney, Agent, or Firm* — Lowenstein Sandler LLP

(57) ABSTRACT

A susceptor includes a plurality of substrate support subsections. The susceptor further includes a vertical-movement component associated with a first substrate support subsection of the plurality of substrate support subsections. The vertical-movement component is configured to vertically move at least a portion of the first substrate support subsection.

20 Claims, 8 Drawing Sheets

(56) References Cited

U.S. PATENT DOCUMENTS

| | | | | |
|---|---|---|---|---|
| 2006/0005770 | A1* | 1/2006 | Tiner | H01L 21/68742 414/935 |
| 2007/0039942 | A1* | 2/2007 | Leung | C23C 16/463 219/443.1 |
| 2010/0138026 | A1* | 6/2010 | Kaushal | G06N 5/04 706/23 |
| 2012/0281333 | A1* | 11/2012 | Mcray | H01L 21/67109 361/234 |
| 2013/0025538 | A1* | 1/2013 | Collins | C30B 25/12 118/712 |
| 2015/0162232 | A1* | 6/2015 | Zhao | H01L 21/67259 361/234 |
| 2015/0366004 | A1* | 12/2015 | Nangoy | H01L 21/6831 219/200 |
| 2015/0376782 | A1* | 12/2015 | Griffin | G01D 5/24 118/712 |
| 2019/0088518 | A1* | 3/2019 | Koh | C23C 16/505 |
| 2019/0333785 | A1* | 10/2019 | Tanikawa | H01L 21/67069 |
| 2020/0083087 | A1* | 3/2020 | Ni | H01J 37/32816 |
| 2020/0110390 | A1* | 4/2020 | Banna | H01L 21/67253 |
| 2020/0395235 | A1* | 12/2020 | Hayahara | H01L 21/6833 |
| 2022/0066411 | A1* | 3/2022 | Ummethala | G06N 20/00 |
| 2022/0181196 | A1* | 6/2022 | Baek | H01L 21/6833 |
| 2023/0143537 | A1* | 5/2023 | Liu | H01L 21/681 427/300 |
| 2023/0194239 | A1* | 6/2023 | Lee | H01L 21/681 356/622 |
| 2023/0268215 | A1* | 8/2023 | Chou | H01L 21/6831 361/234 |
| 2024/0234106 | A9* | 7/2024 | Leeser | H01J 37/32577 |

FOREIGN PATENT DOCUMENTS

| | | | | | |
|---|---|---|---|---|---|
| JP | 2004158610 | A | | 6/2004 | |
| JP | 2014212197 | A | | 11/2014 | |
| JP | 2019149510 | A | * | 9/2019 | H01L 21/68785 |
| JP | 2020155598 | A | | 9/2020 | |
| JP | 2023105422 | A | * | 7/2023 | |
| KR | 20060078545 | A | | 7/2006 | |
| KR | 100722108 | B1 | | 5/2007 | |
| KR | 20220041171 | A | * | 3/2022 | H01L 21/681 |
| KR | 20220084831 | A | * | 6/2022 | H02N 13/00 |
| KR | 20230026953 | A | * | 2/2023 | H01L 21/68785 |
| KR | 20230098638 | A | | 7/2023 | |
| WO | 2022197536 | A1 | | 9/2022 | |

* cited by examiner

SUSCEPTOR HEIGHT ADJUSTMENT

TECHNICAL FIELD

The present disclosure relates to susceptors, more particularly, a susceptor height adjustment.

BACKGROUND

Manufacturing equipment are used to produce products. For example, substrate processing equipment are used to produce substrates.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, a susceptor includes a plurality of substrate support subsections. The susceptor further includes a vertical-movement component associated with a first substrate support subsection of the plurality of substrate support subsections. The vertical-movement component is configured to vertically move at least a portion of the first substrate support subsection.

In another aspect of the disclosure, a method includes the identification of sensor data. The method further includes determining based on the sensor data, offset data between a substrate and a susceptor, the susceptor further including a plurality of substrate support subsections and a vertical-movement component that is associated with a first substrate support subsection of the plurality of substrate support subsections. The vertical-movement component is configured to vertically move at least a portion of the first substrate support subsubsection. The method further includes causing, based on the offset data, actuation of at least the first substrate support subsection via at least the vertical-movement component.

In another aspect of the disclosure, a system includes a memory and a processing device coupled to the memory. The processing device is to identify sensor data. The processing device is further to determine, based on the sensor data, offset data between a substrate surface and a susceptor, the susceptor including a plurality of substrate support subsections and a vertical-movement component associated with a first substrate support subsection pf the plurality of substrate support subsections. The vertical-movement component is configured to vertically move at least a portion of the first substrate support subsection. The processing device to further cause, based on the offset data, actuation of at least the first substrate support subsection via the vertical-movement component.

BRIEF DESCRIPTION OF THE DRAWINGS

The present disclosure is illustrated by way of example, and not by way of limitation in the figures of the accompanying drawings.

DETAILED DESCRIPTION

Figure 1:
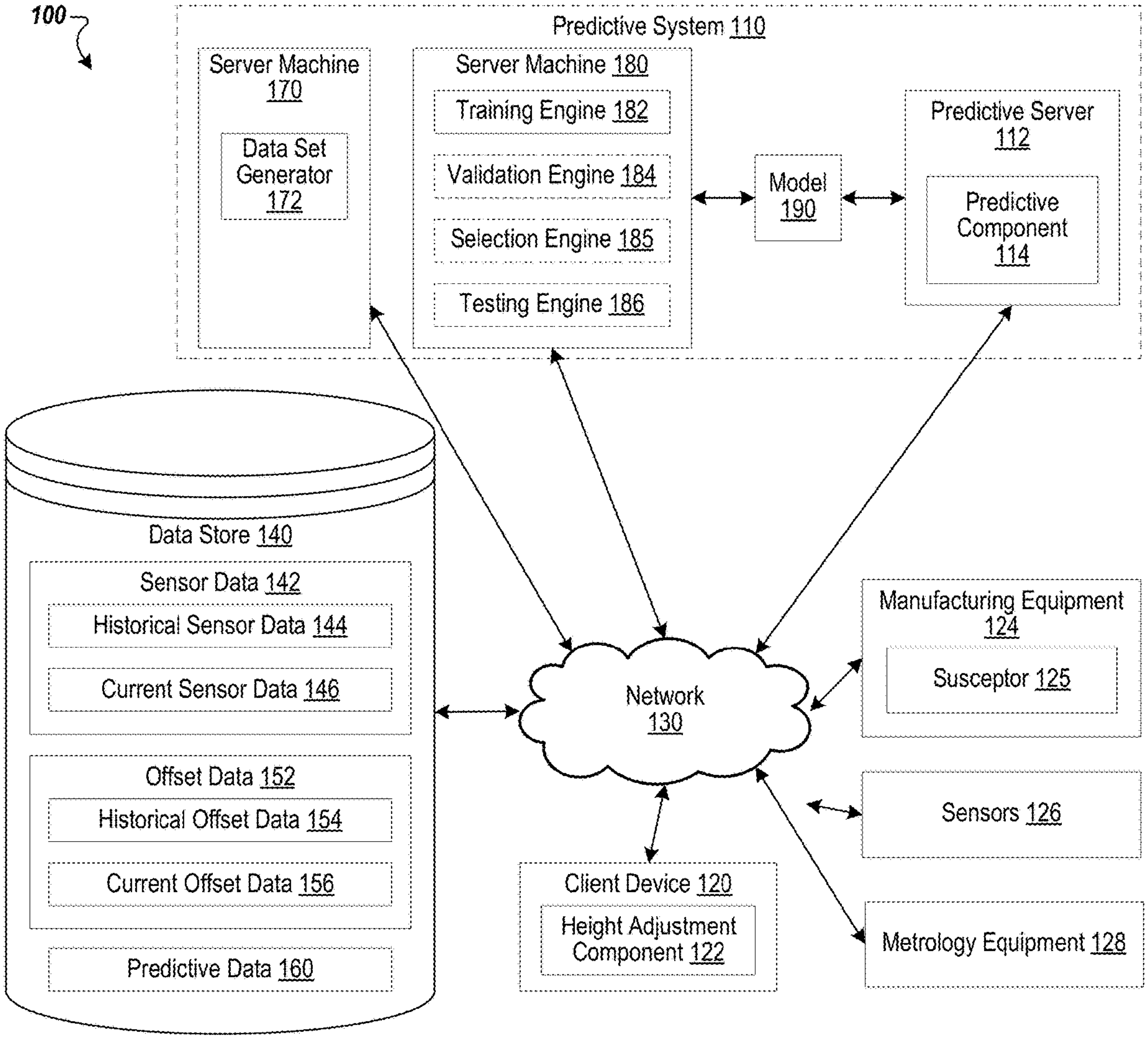
FIG. 1 is a block diagram illustrating an exemplary system architecture, according to certain embodiments.

Described herein are technologies directed to susceptor height adjustment.

Manufacturing equipment include different parts that are used to produce products. For example, substrate processing equipment include support structures on which substrates are disposed in a processing chamber. The lower surface of the substrate is to be flush against a support structure during substrate processing to assist with uniform heating or cooling of the substrate, uniform electrostatic chucking of the substrate, uniform cooling of the substrate, a vacuum against the lower surface of the substrate, and/or the like. Conventional support structures have a fixed upper surface that is planar and non-adjustable.

Some substrates do not have a planar lower surface. The substrate may be concave or convex (e.g., bowed up or bowed down). Features may be disposed on the lower surface of the substrate that cause the lower surface not to be planar. Substrates that do not have a planar lower surface are not flush against a conventional support structure. This causes (e.g., via a single tangential point of contact, outer points of contact, etc. between a substrate and the support structure) defocus issues in substrates (e.g., substrate processing is not focused on the surface of the substrate). Substrate processing with conventional support structures causes non-uniform substrate processing, non-uniform heating, non-uniform electrostatic chucking, non-uniform cooling, non-uniform vacuum against the substrate, production of substrates that do not meet threshold values (e.g., produce bad wafers), reduced yield, reduction in quality, waste of material, etc.

The devices, systems, and methods disclosed herein provide a susceptor height adjustment.

A susceptor may be an electrostatic chuck. The susceptor may be a component on which a substrate is disposed in the processing chamber. The susceptor may be used to heat, cool, electrostatically chuck, provide vacuum against, etc. a substrate (e.g., wafer, semiconductor, display, etc.). The susceptor includes substrate support subsections and vertical-movement components. The substrate may be disposed on the substrate support subsections (e.g., on upper surfaces of the substrate support subsections). In some embodiments, the substrate support subsections may include a temperature adjustment component (e.g., heater, resistive heating element, a heating element, providing thermal energy to or removing thermal energy from conducting fluid, and/or inductive heating) configured to heat and/or cool a portion of a substrate secured to an upper surface of the substrate support subsection. In some embodiments, each substrate support subsection may move independently of another. Each vertical-movement component is configured to vertically move at least a portion of a corresponding substrate support subsection. In some embodiments, the individual vertical-movement components may be mounted on a bellows assembly that enables movement from about 0.0 mm to about 3 mm, about 0.1 mm to about 2 mm, about 0.5 mm to about 1 mm. In some embodiments, the individual vertical-movement components may be attached by a flexible membrane that allows vertical movement as well as the introduction of gas pressure between the respective substrate support subsection (e.g., corresponding to the vertical-movement component) and the substrate. In some embodiments, at least two or more subsections may vertically move to contact the surface of a bowed or flat substrate surface such that the one or more subsections conform to the contour of the substrate. In some embodiments, a vertical-movement component includes a rod (or tube) that is configured to lift and lower a substrate support subsection. In some embodiments, the vertical-movement component includes a piezoelectric component that is configured to lift and lower the substrate support subsection. A piezoelectric (also piezo) may be a material capable of converting electrical energy into mechanical energy or vice versa. The piezoelectric providing micro-adjustments on the order of about 0.01 micrometer (μm) to about 1 μm. In some embodiments the piezoelectric component may be coated (e.g. ceramic or aluminum nitride coatings). In some embodiments, the vertical-movement components move the substrate support subsections to cause the substrate support subsections to contact a lower surface of the substrate. In some embodiments, the vertical-movement components move the substrate support subsections up to contact the lower surface of the substrate, electrostatically secures the lower surface of the substrate, and then moves one or more substrate support subsections down (e.g., to cause the substrate to be more planar).

A processing device may be used to actuate one or more substrate support subsections. The processing device may identify sensor data. In some embodiments, the sensor data is image data, interferometer data, pressure data, and/or capacitance data. In some embodiments, the processing device determines, based on the sensor data, corresponding offset data (e.g., associated with distance between the substrate and one or more of the substrate support subsections). For example, the processing device may determine, based on image data, distances between substrate support subsections and a lower surface of the susceptor). The processing device may cause, based on the offset data, actuation of at least one of the substrate support subsections via at least one corresponding vertical-movement component (e.g., to cause the substrate support subsection to be flush against the substrate, to cause the substrate to be more planar, etc.).

Aspects of the present disclosure result in technological advantages. The present disclosure allows for more focused substrate processing (e.g., less defocus) than conventional systems. The present disclosure may reduce substrate bow (e.g., cause substrates to be more planar) than conventional systems. The present disclosure may have more uniform substrate processing, more uniform heating, more uniform electrostatic chucking, more uniform cooling, more uniform vacuum, and/or the like than conventional systems. The present disclosure produces substrates that more closely meet threshold values than conventional systems. The present disclosure provides a susceptor that more closely conforms to varied substrate surface types compared to conventional systems.

Although some embodiments of the present disclosure describe height adjustment for an electrostatic chuck, the present disclosure can be applied to the other types of adaptive support structures (e.g., in substrate processing, other types of production, etc.).

FIG. 1 is a block diagram illustrating an exemplary system 100 (exemplary system architecture), according to certain embodiments. The system 100 includes a client device 120, manufacturing equipment 124, sensors 126, metrology equipment 128, a predictive server 112, and a data store 140. In some embodiments, the predictive server 112 is part of a predictive system 110. In some embodiments, the predictive system 110 further includes server machines 170 and 180.

In some embodiments, one or more of the client device 120, manufacturing equipment 124, sensors 126, metrology equipment 128, predictive server 112, data store 140, server machine 170, and/or server machine 180 are coupled to each other via a network 130 for generating predictive data 160 to perform susceptor height adjustment. In some embodiments, network 130 is a public network that provides client device 120 with access to the predictive server 112, data store 140, and other publicly available computing devices. In some embodiments, network 130 is a private network that provides client device 120 access to manufacturing equipment 124, sensors 126, metrology equipment 128, data store 140, and other privately available computing devices. In some embodiments, network 130 includes one or more Wide Area Networks (WANs), Local Area Networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

In some embodiments, the client device 120 includes a computing device such as Personal Computers (PCs), laptops, mobile phones, smart phones, tablet computers, netbook computers, etc. In some embodiments, the client device 120 includes a height adjustment component 122. In some embodiments, the height adjustment component 122 may also be included in the predictive system 110 (e.g., machine learning processing system). In some embodiments, the height adjustment component 122 is alternatively included in the predictive system 110 (e.g., instead of being included in client device 120). Client device 120 includes an operating system that allows users to one or more of consolidate, generate, view, or edit data, provide directives to the predictive system 110 (e.g., machine learning processing system), etc.

In some embodiments, height adjustment component 122 receives user input (e.g., via a Graphical User Interface (GUI) displayed via the client device 120), receives sensor data 142 from sensors, etc. In some embodiments, the height adjustment component 122 transmits the data (e.g., user input, sensor data 142, etc.) to the predictive system 110, receives predictive data 160 from the predictive system 110, determines a height adjustment based on the predictive data 160, and causes the height adjustment to be implemented. In some embodiments, the height adjustment component 122 stores data (e.g., user input, sensor data 142, etc.) in the data store 140 and the predictive server 112 retrieves data from the data store 140. In some embodiments, the predictive server 112 stores output (e.g., predictive data 160) of the trained machine learning model 190 in the data store 140 and the client device 120 retrieves the output from the data store 140. In some embodiments, the height adjustment component 122 receives an indication of a height adjustment (e.g., offset data 152, based on predictive data 160) from the predictive system 110 and causes performance of the height adjustment.

In some embodiments, the predictive data 160 is associated with height adjustment. In some embodiments, height adjustment is associated with causing actuation of one or more substrate support subsections of a susceptor via one or more corresponding vertical-movement components of the susceptor. In some embodiments, causing the height adjustment includes providing an alert (e.g., an alarm to not use the substrate processing equipment part or the manufacturing equipment 124 if the predictive data 160 indicates a predicted abnormality, such as an abnormality of the substrate processing equipment part or the product). In some embodiments, causing the height adjustment includes providing feedback control (e.g., cleaning, repairing, and/or replacing the substrate processing equipment part responsive to the predictive data 160 indicating a predicted abnormality).

In some embodiments, the predictive server 112, server machine 170, and server machine 180 each include one or more computing devices such as a rackmount server, a router computer, a server computer, a personal computer, a mainframe computer, a laptop computer, a tablet computer, a desktop computer, Graphics Processing Unit (GPU), accelerator Application-Specific Integrated Circuit (ASIC) (e.g., Tensor Processing Unit (TPU)), etc.

The predictive server 112 includes a predictive component 114. In some embodiments, the predictive component 114 receives sensor data 142 (e.g., receive from the client device 120, retrieve from the data store 140) and generates predictive data 160 associated with susceptor height adjustment. In some embodiments, the predictive component 114 uses one or more trained machine learning models 190 to determine the predictive data 160 for susceptor height adjustment. In some embodiments, trained machine learning model 190 is trained using historical sensor data 144 and historical offset data 154.

In some embodiments, the predictive system 110 (e.g., predictive server 112, predictive component 114) generates predictive data 160 using supervised machine learning (e.g., supervised data set, historical sensor data 144 labeled with historical offset data 154, etc.). In some embodiments, the predictive system 110 generates predictive data 160 using semi-supervised learning (e.g., semi-supervised data set, offset data 152 is a predictive percentage, etc.). In some embodiments, the predictive system 110 generates predictive data 160 using unsupervised machine learning (e.g., unsupervised data set, clustering, clustering based on historical sensor data 144, etc.).

In some embodiments, the manufacturing equipment 124 (e.g., cluster tool) is part of a substrate processing system (e.g., integrated processing system). The manufacturing equipment 124 includes one or more of a controller, an enclosure system (e.g., substrate carrier, front opening unified pod (FOUP), autoteach FOUP, process kit enclosure system, substrate enclosure system, cassette, etc.), a side storage pod (SSP), an aligner device (e.g., aligner chamber), a factory interface (e.g., equipment front end module (EFEM)), a load lock, a transfer chamber, one or more processing chambers (e.g., each including a susceptor 125), a robot arm (e.g., disposed in the transfer chamber, disposed in the front interface, etc.), and/or the like. The enclosure system, SSP, and load lock mount to the factory interface and a robot arm disposed in the factory interface is to transfer content (e.g., substrates, process kit rings, carriers, validation wafer, etc.) between the enclosure system, SSP, load lock, and factory interface. The aligner device is disposed in the factory interface to align the content. The load lock and the processing chambers mount to the transfer chamber and a robot arm disposed in the transfer chamber is to transfer content (e.g., substrates, process kit rings, carriers, validation wafer, etc.) between the load lock, the processing chambers, and the transfer chamber.

In some embodiments, the sensors 126 provide sensor data 142 (e.g., sensor values, such as historical sensor values and current sensor values) associated with manufacturing equipment 124. In some embodiments, the sensors 126 include one or more of an imaging sensor (e.g., camera, imaging device, etc.), a pressure sensor, a temperature sensor, a flow rate sensor, a spectroscopy sensor, capacitance sensor, interferometer sensor, and/or the like. In some embodiments, the sensor data 142 used for equipment health and/or product health (e.g., product quality). In some embodiments, the sensor data 142 are received over a period of time.

In some embodiments, sensors 126 provide sensor data 142 such as one or more of image data, interferometer data, capacitance data, temperature data, pressure data, electrical current data, power data, voltage data, and/or the like.

In some embodiments, the sensor data 142 (e.g., historical sensor data 144, current sensor data 146, etc.) is processed (e.g., by the client device 120 and/or by the predictive server 112). In some embodiments, processing of the sensor data 142 includes generating features. In some embodiments, the features are a pattern in the sensor data 142 (e.g., slope, width, height, peak, etc.) or a combination of values from the sensor data 142 (e.g., power derived from voltage and current, etc.). In some embodiments, the sensor data 142 includes features that are used by the predictive component 114 for obtaining predictive data 160.

In some embodiments, sensor data 142 may include performance data (e.g., metrology data). The metrology equipment 128 (e.g., imaging equipment, spectroscopy equipment, ellipsometry equipment, etc.) is used to determine metrology data (e.g., inspection data, image data, spectroscopy data, ellipsometry data, material compositional, optical, or structural data, etc.) corresponding to substrates produced by the manufacturing equipment 124 (e.g., substrate processing equipment). In some examples, after the manufacturing equipment 124 processes substrates, the metrology equipment 128 is used to inspect portions (e.g., layers) of the substrates. In some embodiments, the metrology equipment 128 performs scanning acoustic microscopy (SAM), ultrasonic inspection, x-ray inspection, and/or computed tomography (CT) inspection. In some examples, after the manufacturing equipment 124 deposits one or more layers on a substrate, the metrology equipment 128 is used to determine quality of the processed substrate (e.g., thicknesses of the layers, uniformity of the layers, interlayer spacing of the layer, and/or the like). In some embodiments, the metrology equipment 128 includes an imaging device (e.g., SAM equipment, ultrasonic equipment, x-ray equipment, CT equipment, and/or the like). In some embodiments, sensor data 142 includes metrology data from metrology equipment 128.

In some embodiments, the data store 140 is memory (e.g., random access memory), a drive (e.g., a hard drive, a flash drive), a database system, or another type of component or device capable of storing data. In some embodiments, data store 140 includes multiple storage components (e.g., multiple drives or multiple databases) that span multiple computing devices (e.g., multiple server computers). In some embodiments, the data store 140 stores one or more of sensor data 142, offset data 152, and/or predictive data 160.

Sensor data 142 includes historical sensor data 144 and current sensor data 146. In some embodiments, sensor data 142 may include one or more of image data, pressure data, interferometer data (e.g. distance data collected via the interference between two incident beams), capacitance data (e.g. distance data collected by measuring how far a component has moved until the component has made contact with the substrate), pressure range, temperature data, temperature range, power data, comparison parameters for comparing inspection data with threshold data, threshold data, cooling rate data, cooling rate range, and/or the like. In some embodiments, at least a portion of the sensor data 142 is from sensors 126. Sensor data 142 may include performance data, such as metrology data. In some examples, the performance data is indicative of whether a substrate is properly designed, properly produced, and/or properly functioning. In some embodiments, at least a portion of the performance data is associated with a quality of substrates produced by the manufacturing equipment 124. In some embodiments, at least a portion of the performance data is based on metrology data from the metrology equipment 128 (e.g., historical performance data includes metrology data indicating properly processed substrates, property data of substrates, yield, etc.). In some embodiments, at least a portion of the performance data is based on inspection of the substrates (e.g., current performance data based on actual inspection). In some embodiments, the performance data includes an indication of an absolute value (e.g., inspection data of the bond interfaces indicates missing the threshold data by a calculated value, deformation value misses the threshold deformation value by a calculated value) or a relative value (e.g., inspection data of the bond interfaces indicates missing the threshold data by 5%, deformation misses threshold deformation by 5%). In some embodiments, the performance data is indicative of meeting a threshold amount of error (e.g., at least 5% error in production, at least 5% error in flow, at least 5% error in deformation, specification limit).

In some embodiments, the client device 120 provides performance data (e.g., product data). In some examples, the client device 120 provides (e.g., based on user input) performance data that indicates an abnormality in products (e.g., defective products). In some embodiments, the performance data includes an amount of products that have been produced that were normal or abnormal (e.g., 98% normal products). In some embodiments, the performance data indicates an amount of products that are being produced that are predicted as normal or abnormal. In some embodiments, the performance data includes one or more of yield a previous batch of products, average yield, predicted yield, predicted amount of defective or non-defective product, or the like. In some examples, responsive to yield on a first batch of products being 98% (e.g., 98% of the products were normal and 2% were abnormal), the client device 120 provides performance data indicating that the upcoming batch of products is to have a yield of 98%.

Offset data 152 may include the historical sensor data as well as historical image data, interferometer data, pressure data, or capacitance data. The historical offset data may be associated with the quality of the substrate processing equipment part, such as metrology data of the substrate processing equipment part, time of failure of substrate processing equipment part, etc. The machine learning model may be trained using data input including the historical sensor data and target output including the historical offset data to generate a trained machine learning model configured to identify a vertical adjustment distance based on sensor data. At block 524 of FIG. 5B, processing logic may use the vertical adjustment distance identified via the trained machine learning model to identify offset data.

Predictive data 160 may include predictive model-generated vertical adjustments generated based on historical sensor data as well as historical metrology data.

In some embodiments, predictive component 114 provides sensor data 142 as input to a trained machine learning model 190 and receives from the trained machine learning model an output associated with predictive data 160. The offset data 152 may be determined based on the predictive data 160.

In some embodiments, historical data includes one or more of historical sensor data 144 and/or historical offset data 154 (e.g., at least a portion for training the machine learning model 190). Current data includes one or more of current sensor data 146 and/or current offset data 156 (e.g., at least a portion to be input into the trained machine learning model 190 subsequent to training the model 190 using the historical data). In some embodiments, the current data is used for retraining the trained machine learning model 190.

In some embodiments, the predictive data 160 is to be used to cause performance of height adjustments on the substrate processing equipment parts.

In some embodiments, predictive system 110 further includes server machine 170 and server machine 180. Server machine 170 includes a data set generator 172 that is capable of generating data sets (e.g., a set of data inputs and a set of target outputs) to train, validate, and/or test a machine learning model(s) 190. The data set generator 172 has functions of data gathering, compilation, reduction, and/or partitioning to put the data in a form for machine learning. In some embodiments (e.g., for small datasets), partitioning (e.g., explicit partitioning) for post-training validation is not used. Repeated cross-validation (e.g., 5-fold cross-validation, leave-one-out-cross-validation) may be used during training where a given dataset is in-effect repeatedly partitioned into different training and validation sets during training. A model (e.g., the best model, the model with the highest accuracy, etc.) is chosen from vectors of models over automatically separated combinatoric subsets. In some embodiments, the data set generator 172 may explicitly partition the historical data (e.g., historical sensor data 144 and corresponding historical offset data 154) into a training set (e.g., sixty percent of the historical data), a validating set (e.g., twenty percent of the historical data), and a testing set (e.g., twenty percent of the historical data). In this embodiment, some operations of data set generator 172 are described in detail below with respect to FIGS. 2 and 5A. In some embodiments, the predictive system 110 (e.g., via predictive component 114) generates multiple sets of features (e.g., training features). In some examples a first set of features corresponds to a first set of types of sensor data (e.g., from a first set of sensors, first combination of values from first set of sensors, first patterns in the values from the first set of sensors) that correspond to each of the data sets (e.g., training set, validation set, and testing set) and a second set of features correspond to a second set of types of sensor data (e.g., from a second set of sensors different from the first set of sensors, second combination of values different from the first combination, second patterns different from the first patterns) that correspond to each of the data sets.

Server machine 180 includes a training engine 182, a validation engine 184, selection engine 185, and/or a testing engine 186. In some embodiments, an engine (e.g., training engine 182, a validation engine 184, selection engine 185, and a testing engine 186) refers to hardware (e.g., circuitry, dedicated logic, programmable logic, microcode, processing device, etc.), software (such as instructions run on a processing device, a general-purpose computer system, or a dedicated machine), firmware, microcode, or a combination thereof. The training engine 182 is capable of training a machine learning model 190 using one or more sets of features associated with the training set from data set generator 172. In some embodiments, the training engine 182 generates multiple trained machine learning models 190, where each trained machine learning model 190 corresponds to a distinct set of parameters of the training set (e.g., sensor data 142) and corresponding responses (e.g., offset data 152). In some embodiments, multiple models are trained on the same parameters with distinct targets for the purpose of modeling multiple effects. In some examples, a first trained machine learning model was trained using sensor data 142 from all sensors 126 (e.g., sensors 1-5), a second trained machine learning model was trained using a first subset of the sensor data (e.g., from sensors 1, 2, and 4), and a third trained machine learning model was trained using a second subset of the sensor data (e.g., from sensors 1, 3, 4, and 5) that partially overlaps the first subset of features.

The validation engine 184 is capable of validating a trained machine learning model 190 using a corresponding set of features of the validation set from data set generator 172. For example, a first trained machine learning model 190 that was trained using a first set of features of the training set is validated using the first set of features of the validation set. The validation engine 184 determines an accuracy of each of the trained machine learning models 190 based on the corresponding sets of features of the validation set. The validation engine 184 evaluates and flags (e.g., to be discarded) trained machine learning models 190 that have an accuracy that does not meet a threshold accuracy. In some embodiments, the selection engine 185 is capable of selecting one or more trained machine learning models 190 that have an accuracy that meets a threshold accuracy. In some embodiments, the selection engine 185 is capable of selecting the trained machine learning model 190 that has the highest accuracy of the trained machine learning models 190.

The testing engine 186 is capable of testing a trained machine learning model 190 using a corresponding set of features of a testing set from data set generator 172. For example, a first trained machine learning model 190 that was trained using a first set of features of the training set is tested using the first set of features of the testing set. The testing engine 186 determines a trained machine learning model 190 that has the highest accuracy of all of the trained machine learning models based on the testing sets.

In some embodiments, the machine learning model 190 (e.g., used for classification) refers to the model artifact that is created by the training engine 182 using a training set that includes data inputs and corresponding target outputs (e.g. correctly classifies a condition or ordinal level for respective training inputs). Patterns in the data sets can be found that map the data input to the target output (the correct classification or level), and the machine learning model 190 is provided mappings that captures these patterns. In some embodiments, the machine learning model 190 uses one or more of Gaussian Process Regression (GPR), Gaussian Process Classification (GPC), Bayesian Neural Networks, Neural Network Gaussian Processes, Deep Belief Network, Gaussian Mixture Model, or other Probabilistic Learning methods. Non probabilistic methods may also be used including one or more of Support Vector Machine (SVM), Radial Basis Function (RBF), clustering, Nearest Neighbor algorithm (k-NN), linear regression, random forest, neural network (e.g., artificial neural network), etc. In some embodiments, the machine learning model 190 is a multivariate analysis (MVA) regression model.

Predictive component 114 provides current sensor data 146 (e.g., as input) to the trained machine learning model 190 and runs the trained machine learning model 190 (e.g., on the input to obtain one or more outputs). The predictive component 114 is capable of determining (e.g., extracting) predictive data 160 from the trained machine learning model 190 and determines (e.g., extracts) uncertainty data that indicates a level of credibility that the predictive data 160 corresponds to current offset data 156. In some embodiments, the predictive component 114 or height adjustment component 122 use the uncertainty data (e.g., uncertainty function or acquisition function derived from uncertainty function) to decide whether to use the predictive data 160 to perform a height adjustment or whether to further train the model 190.

Figure 2:
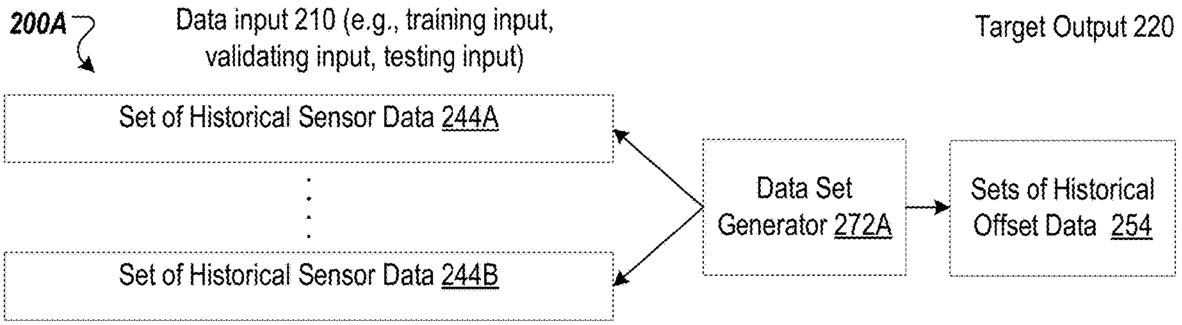
FIG. 2 illustrates a data set generator to create data sets for a machine learning model, according to certain embodiments.

For purpose of illustration, rather than limitation, aspects of the disclosure describe the training of one or more machine learning models 190 using historical data (i.e., prior data, historical sensor data 144 and historical offset data 154) and providing current sensor data 146 into the one or more trained probabilistic machine learning models 190 to determine predictive data 160. In other implementations, a heuristic model or rule-based model is used to determine predictive data 160 (e.g., without using a trained machine learning model). In other implementations non-probabilistic machine learning models may be used. Predictive component 114 monitors historical sensor data 144 and historical offset data 154. In some embodiments, any of the information described with respect to data inputs 210 of FIG. 2 are monitored or otherwise used in the heuristic or rule-based model.

In some embodiments, the functions of client device 120, predictive server 112, server machine 170, and server machine 180 are be provided by a fewer number of machines. For example, in some embodiments, server machines 170 and 180 are integrated into a single machine, while in some other embodiments, server machine 170, server machine 180, and predictive server 112 are integrated into a single machine. In some embodiments, client device 120 and predictive server 112 are integrated into a single machine.

In general, functions described in one embodiment as being performed by client device 120, predictive server 112, server machine 170, and server machine 180 can also be performed on predictive server 112 in other embodiments, if appropriate. In addition, the functionality attributed to a particular component can be performed by different or multiple components operating together. For example, in some embodiments, the predictive server 112 determines height adjustments based on the predictive data 160. In another example, client device 120 determines the predictive data 160 based on data received from the trained machine learning model.

In addition, the functions of a particular component can be performed by different or multiple components operating together. In some embodiments, one or more of the predictive server 112, server machine 170, or server machine 180 are accessed as a service provided to other systems or devices through appropriate application programming interfaces (API).

In some embodiments, a "user" is represented as a single individual. However, other embodiments of the disclosure encompass a "user" being an entity controlled by a plurality of users and/or an automated source. In some examples, a set of individual users federated as a group of administrators is considered a "user."

Although embodiments of the disclosure are discussed in terms of determining predictive data 160 for susceptor height adjustment of substrate processing equipment parts in manufacturing facilities (e.g., substrate processing facilities), in some embodiments, the disclosure can also be generally applied to quality detection. Embodiments can be generally applied to determining quality of parts based on different types of data.

FIG. 2 illustrates a data set generator 272 (e.g., data set generator 172 of FIG. 1) to create data sets for a machine learning model (e.g., model 190 of FIG. 1), according to certain embodiments. In some embodiments, data set generator 272 is part of server machine 170 of FIG. 1. The data sets generated by data set generator 272 of FIG. 2 may be used to train a machine learning model (e.g., see FIG. 5C) to cause performance of a height adjustment (e.g., see FIG. 5D).

Data set generator 272 (e.g., data set generator 172 of FIG. 1) creates data sets for a machine learning model (e.g., model 190 of FIG. 1). Data set generator 272 creates data sets using historical sensor data 244 (e.g., sets of historical sensor data 244A-Z, historical sensor data 144 of FIG. 1) and historical offset data 254 (e.g., historical offset data 154 of FIG. 1). System 200 of FIG. 2 illustrates data set generator 272, data inputs 210, and target output 220 (e.g., target data).

In some embodiments, data set generator 272 generates a data set (e.g., training set, validating set, testing set) that includes one or more data inputs 210 (e.g., training input, validating input, testing input) and one or more target outputs 220 that correspond to the data inputs 210. The data set also includes mapping data that maps the data inputs 210 to the target outputs 220. Data inputs 210 are also referred to as "features," "attributes," or information." In some embodiments, data set generator 272 provides the data set to the training engine 182, validating engine 184, or testing engine 186, where the data set is used to train, validate, or test the machine learning model 190. Some embodiments of generating a training set are further described with respect to FIG. 5A.

In some embodiments, data set generator 272 generates the data input 210 and target output 220. In some embodiments, data inputs 210 include one or more sets of historical sensor data 244. In some embodiments, historical sensor data 244 includes one or more of sensor data from one or more types of sensors, combination of sensor data from one or more types of sensors, patterns from sensor data from one or more types of sensors, and/or the like.

In some embodiments, data set generator 272 generates a first data input corresponding to a first set of historical sensor data 244A to train, validate, or test a first machine learning model and the data set generator 272 generates a second data input corresponding to a second set of historical sensor data 244B to train, validate, or test a second machine learning model.

In some embodiments, the data set generator 272 discretizes (e.g., segments) one or more of the data input 210 or the target output 220 (e.g., to use in classification algorithms for regression problems). Discretization (e.g., segmentation via a sliding window) of the data input 210 or target output 220 transforms continuous values of variables into discrete values. In some embodiments, the discrete values for the data input 210 indicate discrete historical sensor data 244 to obtain a target output 220 (e.g., discrete historical offset data 254).

Data inputs 210 and target outputs 220 to train, validate, or test a machine learning model include information for a particular facility (e.g., for a particular substrate manufacturing facility). In some examples, historical sensor data 244 and historical offset data 254 are for the same manufacturing facility.

In some embodiments, the information used to train the machine learning model is from specific types of manufacturing equipment 124 of the manufacturing facility having specific characteristics and allow the trained machine learning model to determine outcomes for a specific group of manufacturing equipment 124 based on input for current parameters (e.g., current sensor data 146) associated with one or more components sharing characteristics of the specific group. In some embodiments, the information used to train the machine learning model is for components from two or more manufacturing facilities and allows the trained machine learning model to determine outcomes for components based on input from one manufacturing facility.

In some embodiments, subsequent to generating a data set and training, validating, or testing a machine learning model 190 using the data set, the machine learning model 190 is further trained, validated, or tested (e.g., current offset data 156 of FIG. 1) or adjusted (e.g., adjusting weights associated with input data of the machine learning model 190, such as connection weights in a neural network).

Figure 3:
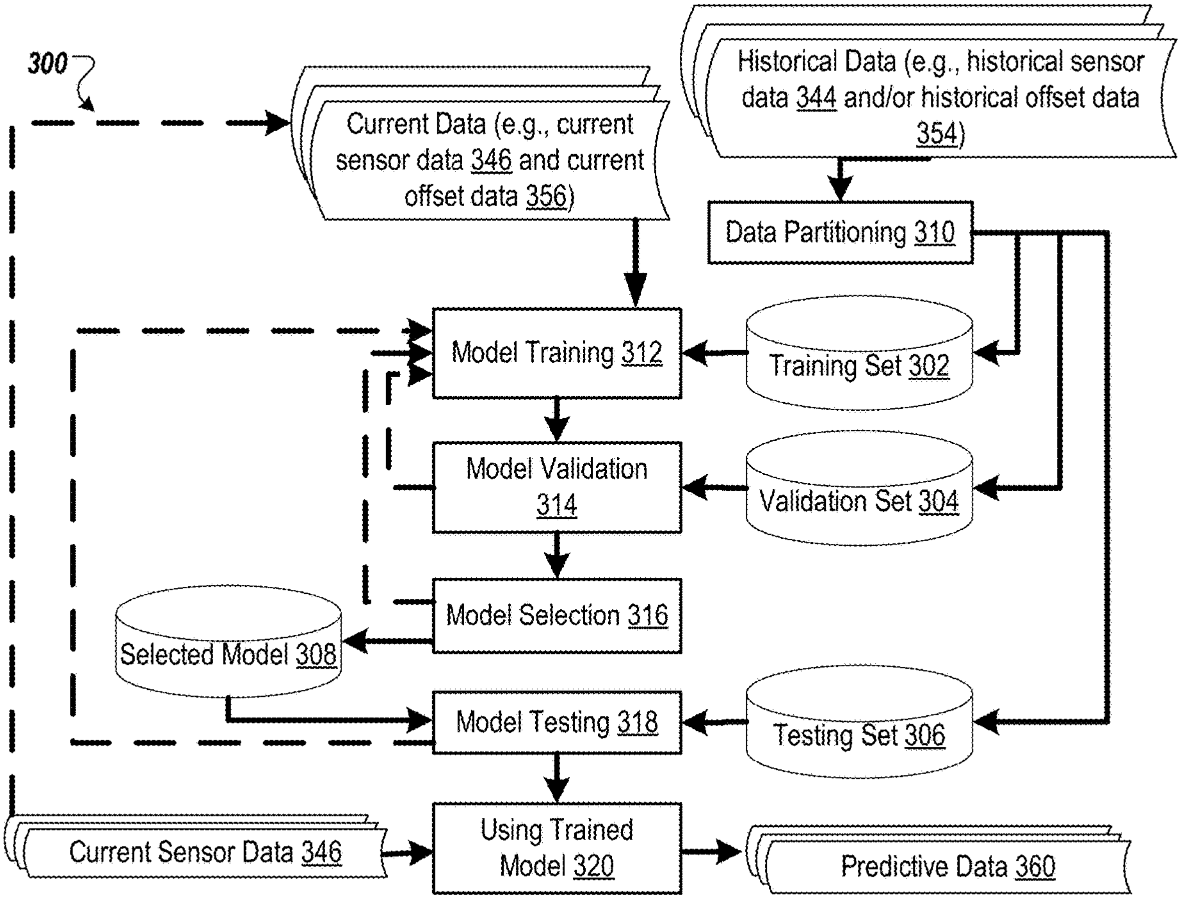
FIG. 3 is a block diagram illustrating determining predictive data, according to certain embodiments.

FIG. 3 is a block diagram illustrating a system 300 for generating predictive data 360 (e.g., predictive data 160 of FIG. 1), according to certain embodiments. The system 300 is used to determine predictive data 360 via a trained machine learning model (e.g., model 190 of FIG. 1) for susceptor height adjustment (e.g., for performance of a height adjustment).

At block 310, the system 300 (e.g., predictive system 110 of FIG. 1) performs data partitioning (e.g., via data set generator 172 of server machine 170 of FIG. 1) of the historical data (e.g., historical sensor data 344 and historical offset data 354 for model 190 of FIG. 1) to generate the training set 302, validation set 304, and testing set 306. In some examples, the training set is 60% of the historical data, the validation set is 20% of the historical data, and the testing set is 20% of the historical data. The system 300 generates a plurality of sets of features for each of the training set, the validation set, and the testing set. In some examples, if the historical data includes features derived from 20 sensors (e.g., sensors 126 of FIG. 1) and 100 products (e.g., products that each correspond to sensor data from the 20 sensors), a first set of features is sensors 1-10, a second set of features is sensors 11-20, the training set is products 1-60, the validation set is products 61-80, and the testing set is products 81-100. In this example, the first set of features of the training set would be parameters from sensors 1-10 for products 1-60.

At block 312, the system 300 performs model training (e.g., via training engine 182 of FIG. 1) using the training set 302. In some embodiments, the system 300 trains multiple models using multiple sets of features of the training set 302 (e.g., a first set of features of the training set 302, a second set of features of the training set 302, etc.). For example, system 300 trains a machine learning model to generate a first trained machine learning model using the first set of features in the training set (e.g., sensor data from sensors 1-10 for products 1-60) and to generate a second trained machine learning model using the second set of features in the training set (e.g., sensor data from sensors 11-20 for products 1-60). In some embodiments, the first trained machine learning model and the second trained machine learning model are combined to generate a third trained machine learning model (e.g., which is a better predictor than the first or the second trained machine learning model on its own in some embodiments). In some embodiments, sets of features used in comparing models overlap (e.g., first set of features being sensor data from sensors 1-15 and second set of features being sensor data from sensors 5-20). In some embodiments, hundreds of models are generated including models with various permutations of features and combinations of models.

At block 314, the system 300 performs model validation (e.g., via validation engine 184 of FIG. 1) using the validation set 304. The system 300 validates each of the trained models using a corresponding set of features of the validation set 304. For example, system 300 validates the first trained machine learning model using the first set of features in the validation set (e.g., parameters from sensors 1-10 for products 61-80) and the second trained machine learning model using the second set of features in the validation set (e.g., parameters from sensors 11-20 for products 61-80). In some embodiments, the system 300 validates hundreds of models (e.g., models with various permutations of features, combinations of models, etc.) generated at block 312. At block 314, the system 300 determines an accuracy of each of the one or more trained models (e.g., via model validation) and determines whether one or more of the trained models has an accuracy that meets a threshold accuracy. Responsive to determining that none of the trained models has an accuracy that meets a threshold accuracy, flow returns to block 312 where the system 300 performs model training using different sets of features of the training set. Responsive to determining that one or more of the trained models has an accuracy that meets a threshold accuracy, flow continues to block 316. The system 300 discards the trained machine learning models that have an accuracy that is below the threshold accuracy (e.g., based on the validation set).

At block 316, the system 300 performs model selection (e.g., via selection engine 185 of FIG. 1) to determine which of the one or more trained models that meet the threshold accuracy has the highest accuracy (e.g., the selected model 308, based on the validating of block 314). Responsive to determining that two or more of the trained models that meet the threshold accuracy have the same accuracy, flow returns to block 312 where the system 300 performs model training using further refined training sets corresponding to further refined sets of features for determining a trained model that has the highest accuracy.

At block 318, the system 300 performs model testing (e.g., via testing engine 186 of FIG. 1) using the testing set 306 to test the selected model 308. The system 300 tests, using the first set of features in the testing set (e.g., sensor data from sensors 1-10 for products 81-100), the first trained machine learning model to determine the first trained machine learning model meets a threshold accuracy (e.g., based on the first set of features of the testing set 306). Responsive to accuracy of the selected model 308 not meeting the threshold accuracy (e.g., the selected model 308 is overly fit to the training set 302 and/or validation set 304 and is not applicable to other data sets such as the testing set 306), flow continues to block 312 where the system 300 performs model training (e.g., retraining) using different training sets corresponding to different sets of features (e.g., sensor data from different sensors). Responsive to determining that the selected model 308 has an accuracy that meets a threshold accuracy based on the testing set 306, flow continues to block 320. In at least block 312, the model learns patterns in the historical data to make predictions and in block 318, the system 300 applies the model on the remaining data (e.g., testing set 306) to test the predictions.

At block 320, system 300 uses the trained model (e.g., selected model 308) to receive current sensor data 346 (e.g., current sensor data 146 of FIG. 1) and determines (e.g., extracts), from the trained model, predictive data 360 (e.g., predictive data 160 of FIG. 1) for susceptor height adjustment to perform a height adjustment. In some embodiments, the current sensor data 346 corresponds to the same types of features in the historical sensor data 344. In some embodiments, the current sensor data 346 corresponds to a same type of features as a subset of the types of features in historical sensor data 344 that is used to train the selected model 308.

In some embodiments, current data is received. In some embodiments, current data includes current offset data 356 (e.g., current offset data 156 of FIG. 1) and/or current sensor data 346. In some embodiments, at least a portion of the current data is received from metrology equipment (e.g., metrology equipment 128 of FIG. 1) or via user input. In some embodiments, the model 308 is re-trained based on the current data. In some embodiments, a new model is trained based on the current offset data 356 and the current sensor data 346.

In some embodiments, one or more of the blocks 310-320 occur in various orders and/or with other operations not presented and described herein. In some embodiments, one or more of blocks 310-320 are not be performed. For example, in some embodiments, one or more of data partitioning of block 310, model validation of block 314, model selection of block 316, and/or model testing of block 318 are not be performed.

FIGS. 4A-L illustrate substrate support subsections 440, according to certain embodiments.

Figure 4A:
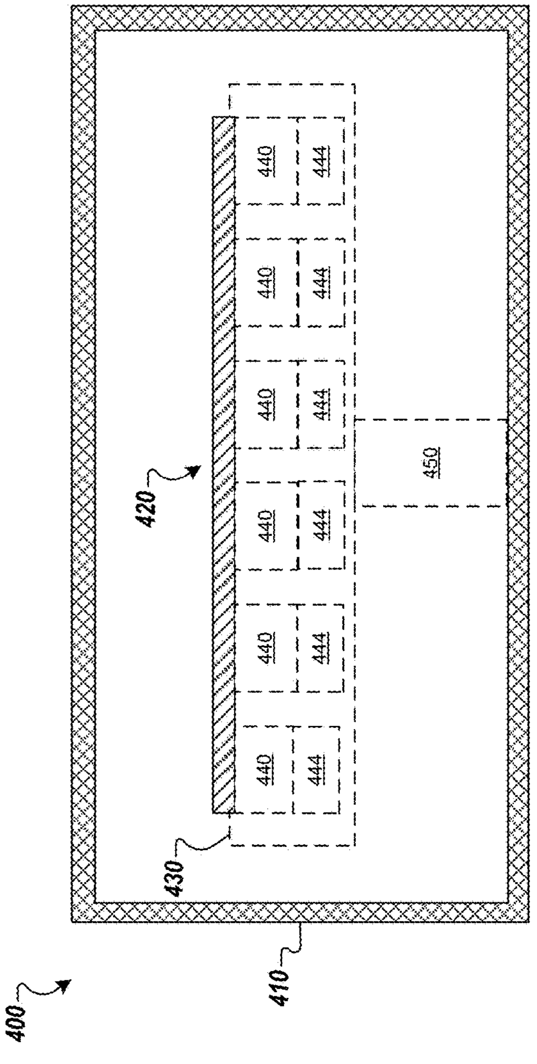
FIGS. 4A-L illustrate substrate support subsections, according to certain embodiments.

FIG. 4A illustrates a processing chamber 400, according to certain embodiments. Processing chamber 400 may be part of a substrate processing system (e.g., manufacturing equipment 124 of FIG. 1). In some embodiments, the processing chamber 400 is coupled to a transfer chamber. A transfer chamber robot may be configured to transport a substrate 420 into the processing chamber 400, deposit the substrate 420 in the processing chamber 400 for processing, and remove a substrate 420 from the processing chamber 400 responsive to the substrate 420 being processed.

Processing chamber may include a housing 410 that includes walls (e.g., sidewalls, upper wall, bottom wall) that at least partially enclose an interior volume. The housing 410 may contain a susceptor 430. In some embodiments, the susceptor 430 includes electrodes (e.g., the susceptor 430 is an electrostatic chuck). In some embodiments, the susceptor 430 includes heating elements. In some embodiments, the susceptor 430 is configured to electrostatically chuck, heat, cool, secure via vacuum, and/or the like a substrate 420 disposed on the susceptor 430. Susceptor 430 may include substrate support subsections 440. A substrate 420 may be disposed on the substrate support subsections 440. A shaft 450 may be disposed under (e.g., support) the susceptor 430. In some embodiments, the susceptor 430 includes vertical-movement components 444. Each of the substrate support sections 440 may be associated with a corresponding vertical-movement component 444. Each vertical-movement component 444 may be configured to vertically move (e.g., up and down) at least a portion of a corresponding substrate support subsection 440. In some embodiments, the vertical-movement component 444 is a piezoelectric actuator, a rod (or tube), or shaft 450 moved via an actuator (e.g., see FIGS. 4B-D).

Figure 4B:
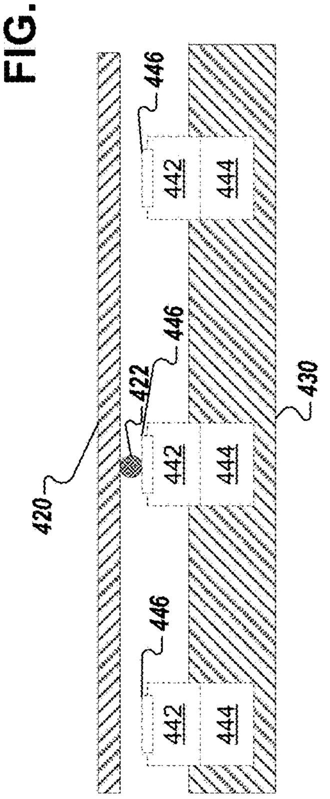
Figure 4C:
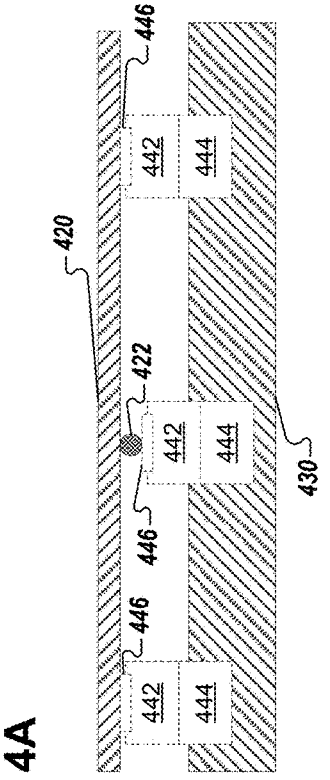
Figure 4D:
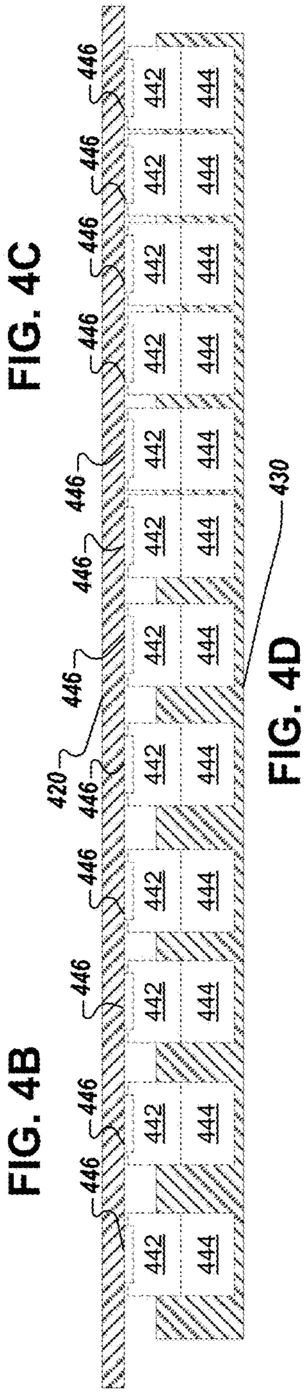

FIGS. 4B-D illustrate a substrate 420 disposed on a susceptor 430, according to certain embodiments.

FIG. 4B illustrates a substrate 420 disposed on a susceptor 430, according to certain embodiments. The susceptor 430 may include substrate support subsections 440. In some embodiments, the substrate support subsections are distributed in a susceptor 430. In some embodiments the distribution of the subsections forms a continuous substrate support surface. In some embodiments the distribution of the substrate support subsections are distributed such that there is space between the substrate support subsection surfaces.

The substrate 420 may include a feature 422 (e.g., surface deviation) disposed on a lower surface of substrate 420 that causes the lower surface not to be planar. Responsive to the substrate 420 being placed on the susceptor 430, the feature 422 may be disposed on one or more substrate support subsections 440. A feature 422 may include a component that has been formed (e.g., disposed, etched, etc.) on a lower surface of the substrate 420. A feature 422 may include microelectronic devices (e.g. transistors, capacitors, inductors, resistors, diodes, insulators, or conductors), doped wafer layers, etched wafer layers, thin-film deposited layers, and photolithographic patterns. A substrate support subsection 440 may include a vertical-movement component 444 (e.g. a piezoelectric actuator, a rod (or tube), or a shaft), an electrostatic element 442 (e.g. components necessary to provide current to a piezoelectric cell for actuation, or control the actuation of a shaft or rod (or tube)), and an electrostatic mesa 446 (e.g. a coated surface that makes contact with the substrate surface such as ceramic or aluminum nitride).

FIG. 4C illustrates a substrate 420 disposed on a susceptor 430, according to certain embodiments. FIG. 4C illustrates the movement of substrate support subsections 440 to conform to the lower surface of a substrate 420 to account for the presence of features 422. In some embodiments the substrate support subsections may remain stationary after making contact with the substrate surface. In some embodiments the substrate support subsections may move after making contact and attaching to the substrate surface to adjust (e.g., correct) the bow of the substrate surface.

FIG. 4D illustrates that substrate support subsections 440 may be distributed in the susceptor 430 at varied distances in order to provide dispersed support for a disposed substrate 420. In some embodiments the distribution of the substrate support subsections may form a continuous substrate support surface. In some embodiments the distribution of the substrate support subsections may allow for space between the substrate support subsection surfaces.

Figure 4E:
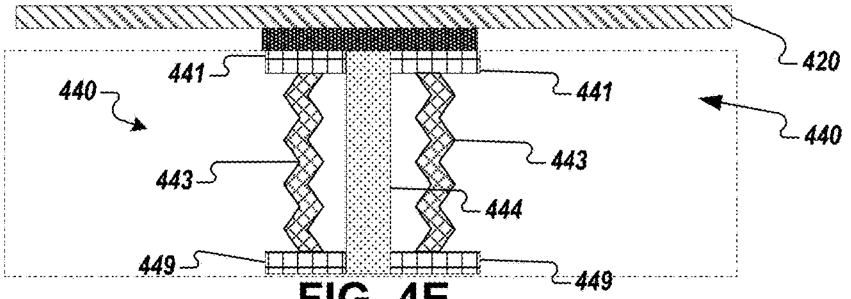

FIG. 4E illustrates a substrate 420 disposed on a substrate support subsection 440. Substrate support subsections 440 may include an electrostatic chuck mesa 446 that makes contact with the surface of the substrate. The substrate support subsection 440 may further include a flange 441 that surrounds a rod 445 (or tube) that moves the electrostatic chuck mesa. The substrate support subsection may further include bellows 443 that support the vertical movement of the rod (or tube). The rod 445 (or tube) may further be contained by a lower flange 449. The bellows 443, flange 441, and lower flange 449 may substantially seal the rod 445 (or tube) from a surrounding environment (e.g., prevent particles from travelling from the rod 445 (or tube) to other portions of the processing chamber.

Figure 4F:
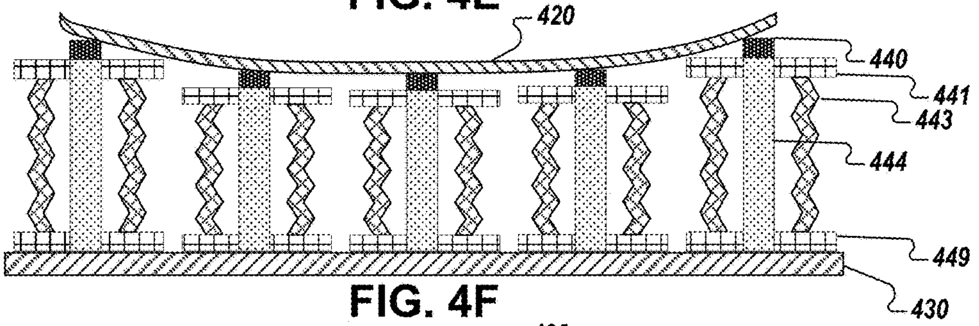

FIG. 4F illustrates substrate support subsections 440 substantially conforming to the shape of a substrate 420 bowed in a convex shape. For illustration, five subsections are depicted, however any number of subsections with any distributed distance between the subsections may be employed. The substrate support subsections 440 may remain stationary to support the bowed or uneven surface of the substrate 420 or may move to correct the bow in the substrate 420 (e.g., see FIG. 4G) and then continue to support the planar surface of the substrate 420 if any features are present.

Figure 4G:
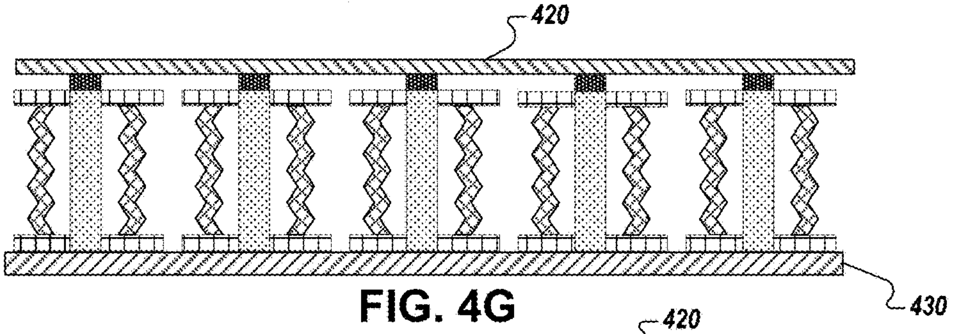

FIG. 4G illustrates substrate support subsections 440 moving to correct either a convex or concave bow of a substrate 420. For illustration, five subsections are depicted, however any number of subsections with any distributed distance between the subsections may be employed. The substrate support subsections 440 may contact a surface of the substrate 420, electrostatically secure the substrate 420, and then move to cause the substrate 420 to be substantially planar.

Figure 4H:
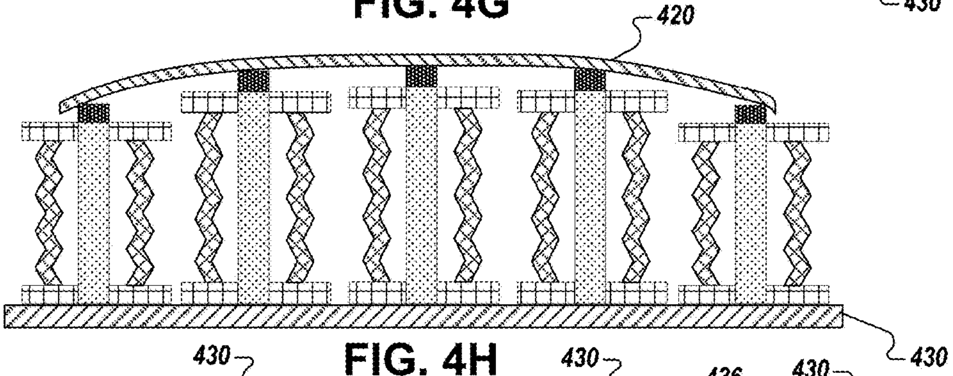
Figures 4I, 4J, 4K, 4L:
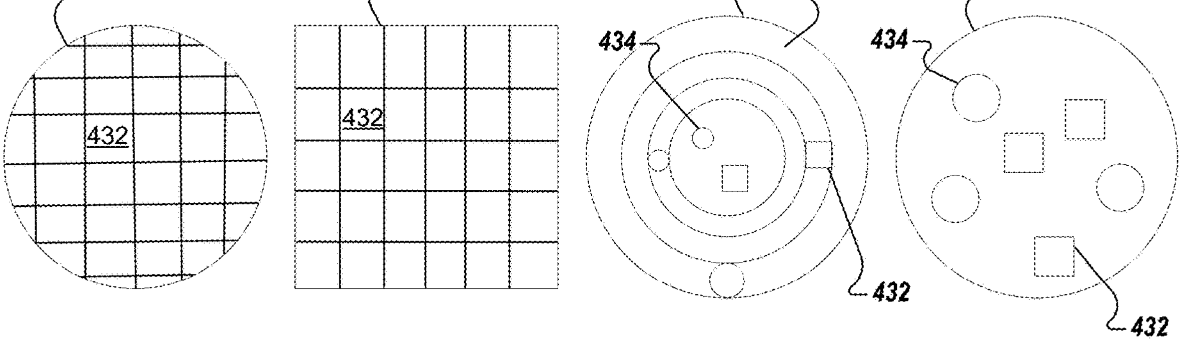

FIG. 4H illustrates substrate support subsections 440 substantially conforming to the shape of a substrate 420 bowed in a concave manner. For illustration, five subsections are depicted, however any number of subsections with any distributed distance between the subsections may be employed. The substrate support subsections 440 may remain stationary to support the bowed or uneven surface of the substrate 420 or may move to correct the bow in the substrate 420 and then continue to support the planar surface (e.g., see FIG. 4G) of the substrate 420 if any features are present.

FIGS. 4I-L illustrate an upper view of a susceptor 430 including substrate support subsections 440, according to certain embodiments. Substrate support subsections 440 (e.g., upper perimeters of substrate support subsections 440) may have different shapes (e.g., circle 432, square or rectangle 434, concentric circular rings 436, or a combination thereof.) Substrate support subsection 440 may be substantially rectangular, substantially circular, or have shapes modified in other ways to substantially support a substrate 420 (e.g., based on features of the substrate 420, based on curvature of the substrate 420, etc.). Substrate support subsections 440 may also be concentric circles 426, or a combination of the previously mentioned structure types. Additionally, the substrate support subsections 440 may be adjacent to one another such that a continuous support surface is formed. Substrate support subsections 440 may also be distributed such that there is space between the substrate support subsections 440 (e.g., between upper perimeters of the substrate support subsections).

FIGS. 5A-D are flow diagrams of methods 500A-D associated with susceptor height adjustment, according to certain embodiments. In some embodiments, methods 500A-D are performed by processing logic that includes hardware (e.g., circuitry, dedicated logic, programmable logic, microcode, processing device, etc.), software (such as instructions run on a processing device, a general-purpose computer system, or a dedicated machine), firmware, microcode, or a combination thereof. In some embodiments, methods 500A-D are performed, at least in part, by predictive system 110. In some embodiments, method 500A is performed, at least in part, by predictive system 110 (e.g., server machine 170 and data set generator 172 of FIG. 1, data set generator 272 of FIG. 2). In some embodiments, predictive system 110 uses method 500A to generate a data set to at least one of train, validate, or test a machine learning model. In some embodiments, method 500B is performed by client device 120 or predictive system 110 (e.g., height adjustment component 122). In some embodiments, method 500C is performed by server machine 180 (e.g., training engine 182, etc.). In some embodiments, method 500D is performed by predictive server 112 (e.g., predictive component 114). In some embodiments, method 500D is performed by client device 120 (e.g., height adjustment component 122). In some embodiments, a non-transitory storage medium stores instructions that when executed by a processing device (e.g., of predictive system 110, of server machine 180, of predictive server 112, of client device 120, etc.), cause the processing device to perform one or more of methods 500A-D.

For simplicity of explanation, methods 500A-D are depicted and described as a series of operations. However, operations in accordance with this disclosure can occur in various orders and/or concurrently and with other operations not presented and described herein. Furthermore, in some embodiments, not all illustrated operations are performed to implement methods 500A-D in accordance with the disclosed subject matter. In addition, those skilled in the art will understand and appreciate that methods 500A-D could alternatively be represented as a series of interrelated states via a state diagram or events.

Figure 5A:
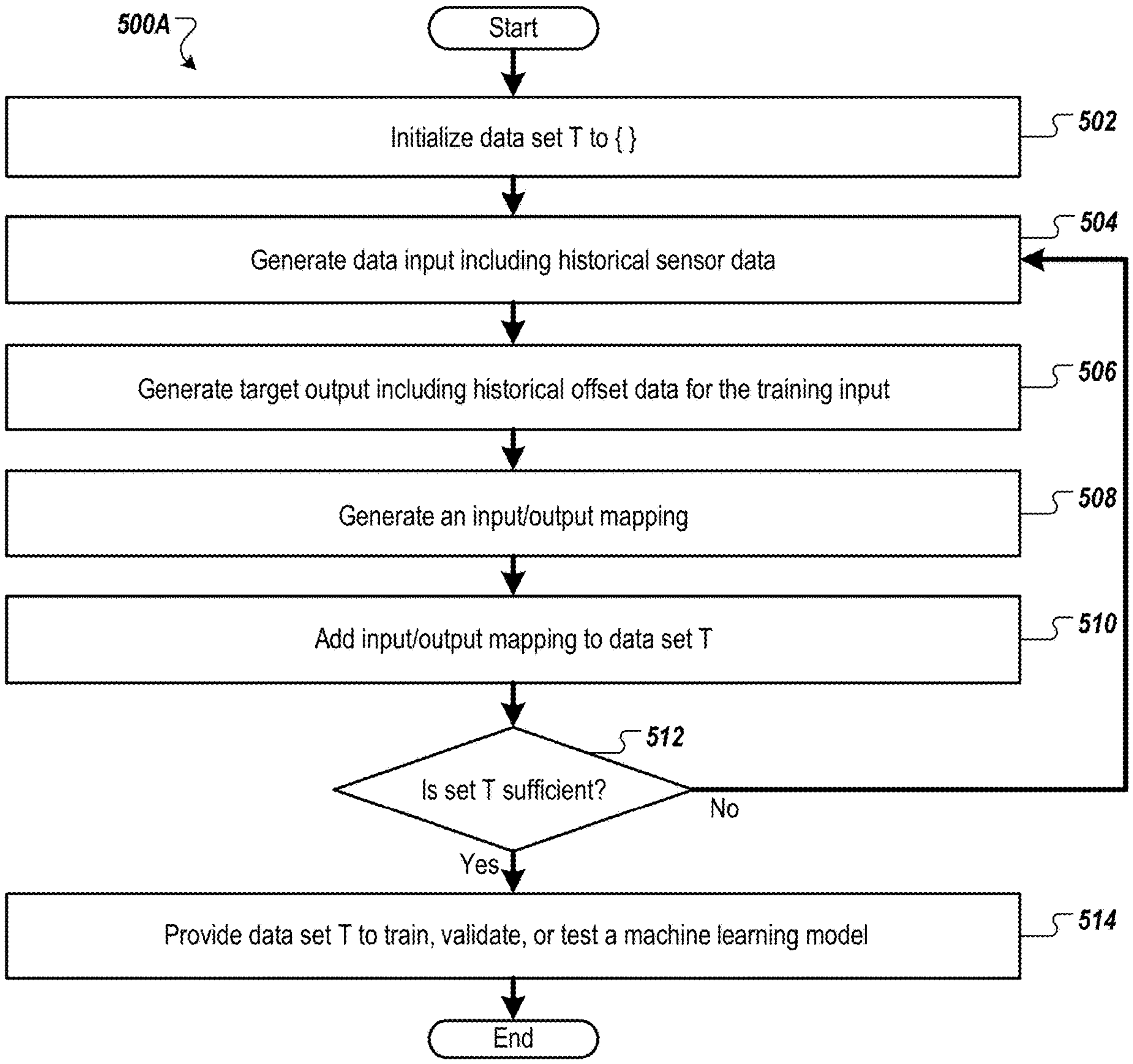
FIGS. 5A-D are flow diagrams of methods associated with susceptor height adjustment, according to certain embodiments.

FIG. 5A is a flow diagram of a method 500A for generating a data set for a machine learning model for generating predictive data (e.g., predictive data 160 of FIG. 1), according to certain embodiments.

Referring to FIG. 5A, in some embodiments, at block 502 the processing logic implementing method 500A initializes a training set T to an empty set.

At block 504, processing logic generates first data input (e.g., first training input, first validating input) that includes sensor data (e.g., historical sensor data 144 of FIG. 1, historical sensor data 244 of FIG. 2, etc.). In some embodiments, the first data input includes a first set of features for types of sensor data and a second data input includes a second set of features for types of sensor data (e.g., as described with respect to FIG. 2).

At block 506, processing logic generates a first target output for one or more of the data inputs (e.g., first data input). In some embodiments, the first target output is historical offset data (e.g., historical offset data 154 of FIG. 1, historical offset data 254 of FIG. 2).

At block 508, processing logic optionally generates mapping data that is indicative of an input/output mapping. The input/output mapping (or mapping data) refers to the data input (e.g., one or more of the data inputs described herein), the target output for the data input (e.g., where the target output identifies historical offset data 154), and an association between the data input(s) and the target output.

At block 510, processing logic adds the mapping data generated at block 508 to data set T.

At block 512, processing logic branches based on whether data set T is sufficient for at least one of training, validating, and/or testing machine learning model 190 (e.g., uncertainty of the trained machine learning model meets a threshold uncertainty). If so, execution proceeds to block 514, otherwise, execution continues back to block 504. It should be noted that in some embodiments, the sufficiency of data set T is determined based simply on the number of input/output mappings in the data set, while in some other implementations, the sufficiency of data set T is determined based on one or more other criteria (e.g., a measure of diversity of the data examples, accuracy, etc.) in addition to, or instead of, the number of input/output mappings.

At block 514, processing logic provides data set T (e.g., to server machine 180) to train, validate, and/or test machine learning model 190. In some embodiments, data set T is a training set and is provided to training engine 182 of server machine 180 to perform the training. In some embodiments, data set T is a validation set and is provided to validation engine 184 of server machine 180 to perform the validating. In some embodiments, data set T is a testing set and is provided to testing engine 186 of server machine 180 to perform the testing. In the case of a neural network, for example, input values of a given input/output mapping (e.g., numerical values associated with data inputs 210) are input to the neural network, and output values (e.g., numerical values associated with target outputs 220) of the input/output mapping are stored in the output nodes of the neural network. The connection weights in the neural network are then adjusted in accordance with a learning algorithm (e.g., back propagation, etc.), and the procedure is repeated for the other input/output mappings in data set T.

After block 514, machine learning model (e.g., machine learning model 190) can be at least one of trained using training engine 182 of server machine 180, validated using validating engine 184 of server machine 180, or tested using testing engine 186 of server machine 180. The trained machine learning model is implemented by predictive component 114 (of predictive server 112) to generate predictive data (e.g., predictive data 160) to cause performance of susceptor height adjustment.

Figure 5B:
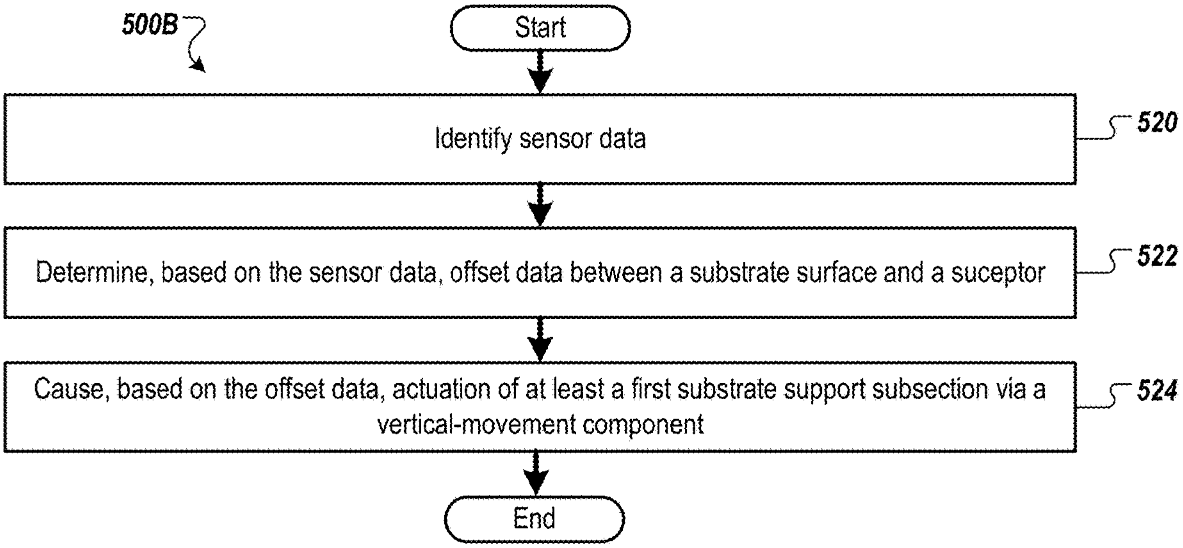

FIG. 5B is a method 500B associated with susceptor height adjustment, according to certain embodiments.

At block 520 of method 500B, the processing logic identifies sensor data. In some embodiments, the sensor data is associated with a substrate disposed on a susceptor. In some embodiments, the sensor data is one or more of image data, interferometer data, pressure data, and/or capacitance data.

At block 522, the processing logic determines, based on the sensor data, offset data associated with distance between the substrate and one or more of the substrate support subsections.

At block 524, the processing logic causes, based on the offset data, actuation of at least a first substrate support subsection via a vertical-movement component.

Figure 5C:
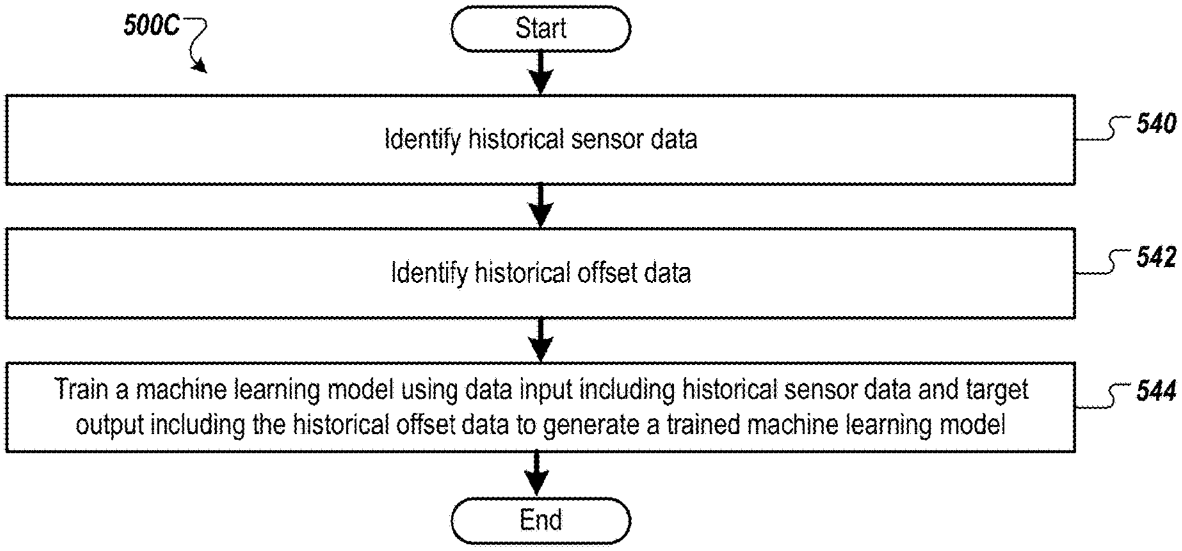
Figure 5D:
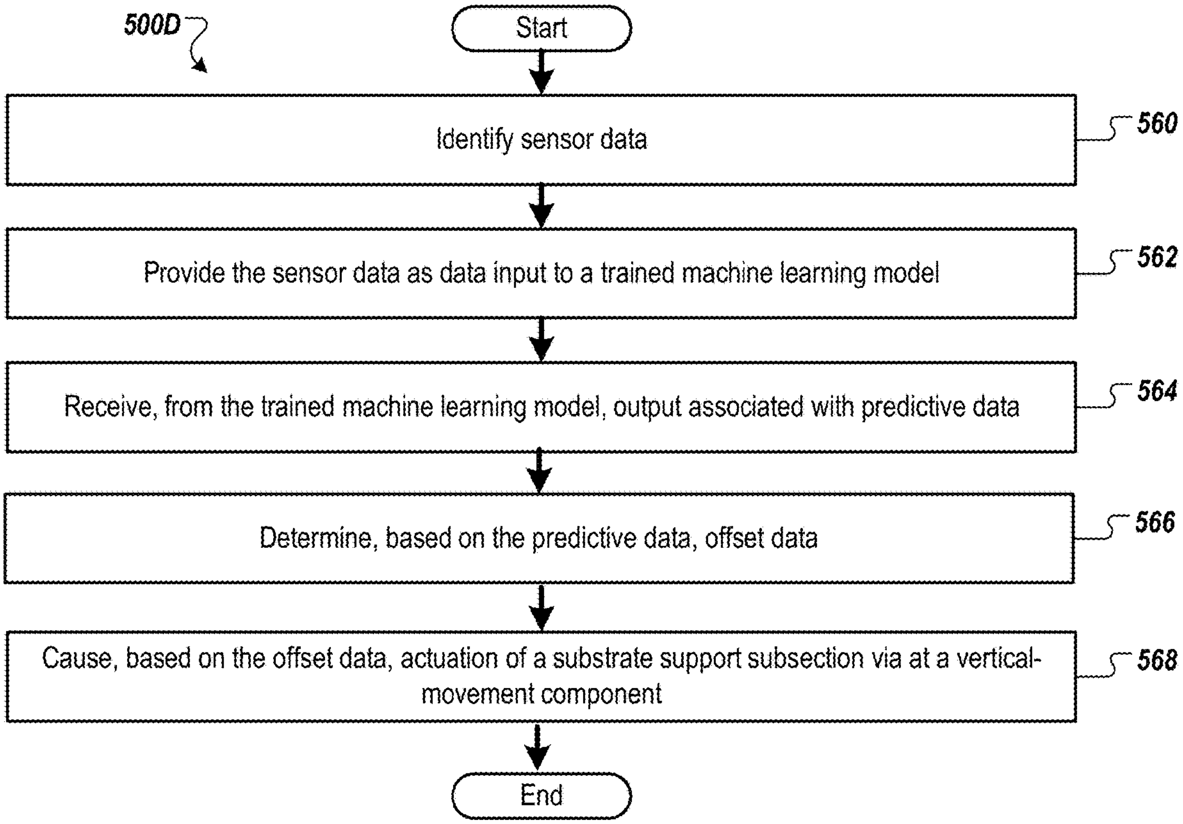

In some embodiments, the processing logic may determine the threshold area using a machine learning model (e.g., see FIGS. 5C-D).

FIG. 5C is a method for training a machine learning model (e.g., model 190 of FIG. 1) for determining predictive data (e.g., predictive data 160 of FIG. 1) for susceptor height adjustment via data analytics.

Referring to FIG. 5C, at block 540 of method 500C, the processing logic identifies historical sensor data (e.g., historical sensor data 144 of FIG. 1, historical input sensor data).

At block 542, the processing logic identifies historical offset data (e.g., historical offset data 154 of FIG. 1, historical output offset data). At least a portion of the historical sensor data and the historical offset data may be associated with new substrate processing equipment parts (e.g., used for benchmarking).

At block 544, the processing logic trains a machine learning model using data input including historical sensor data and target output including the historical offset data to generate a trained machine learning model.

In some embodiments, the historical sensor data of block 540 includes historical image data, interferometer data, pressure data, or capacitance data and the historical offset data of block 542 corresponds to historical offset data. The historical offset data may be associated with the quality of the substrate processing equipment part, such as metrology data of the substrate processing equipment part, time of failure of substrate processing equipment part, etc. At block 544, the machine learning model may be trained using data input including the historical sensor data and target output including the historical offset data to generate a trained machine learning model configured to identify a vertical adjustment distance based on sensor data. At block 524 of FIG. 5B, processing logic may use the vertical adjustment distance identified via the trained machine learning model to identify offset data.

At block 544, the machine learning model may be trained using data input including the historical sensor data and target output including the vertical adjustment distance to generate a trained machine learning model configured to predict offset data. Responsive to the predicted offset data meeting a first threshold, the processing logic may cause a height adjustment. Responsive to the predicted offset data meeting a second threshold, the processing logic may cause the substrate processing equipment part to be used in the substrate processing system.

FIG. 5D is a method 500D for using a trained machine learning model (e.g., model 190 of FIG. 1) for susceptor height adjustment to cause performance of a height adjustment.

Referring to FIG. 5D, at block 560 of method 500D, the processing logic identifies sensor data.

At block 562, the processing logic provides the sensor data as data input to a trained machine learning model (e.g., trained via block 544 of FIG. 5C).

At block 564, the processing logic receives, from the trained machine learning model, output associated with predictive data.

At block 566, the processing logic causes, based on the predictive data, performance of a height adjustment.

In some embodiments the trained machine learning model of block 562 was trained using data input including historical sensor data and target output including historical offset data. The predictive data of block 564 may be associated with a threshold area. In some embodiments, at block 566, the processing logic determines the offset data based on the predictive data.

Figure 6:
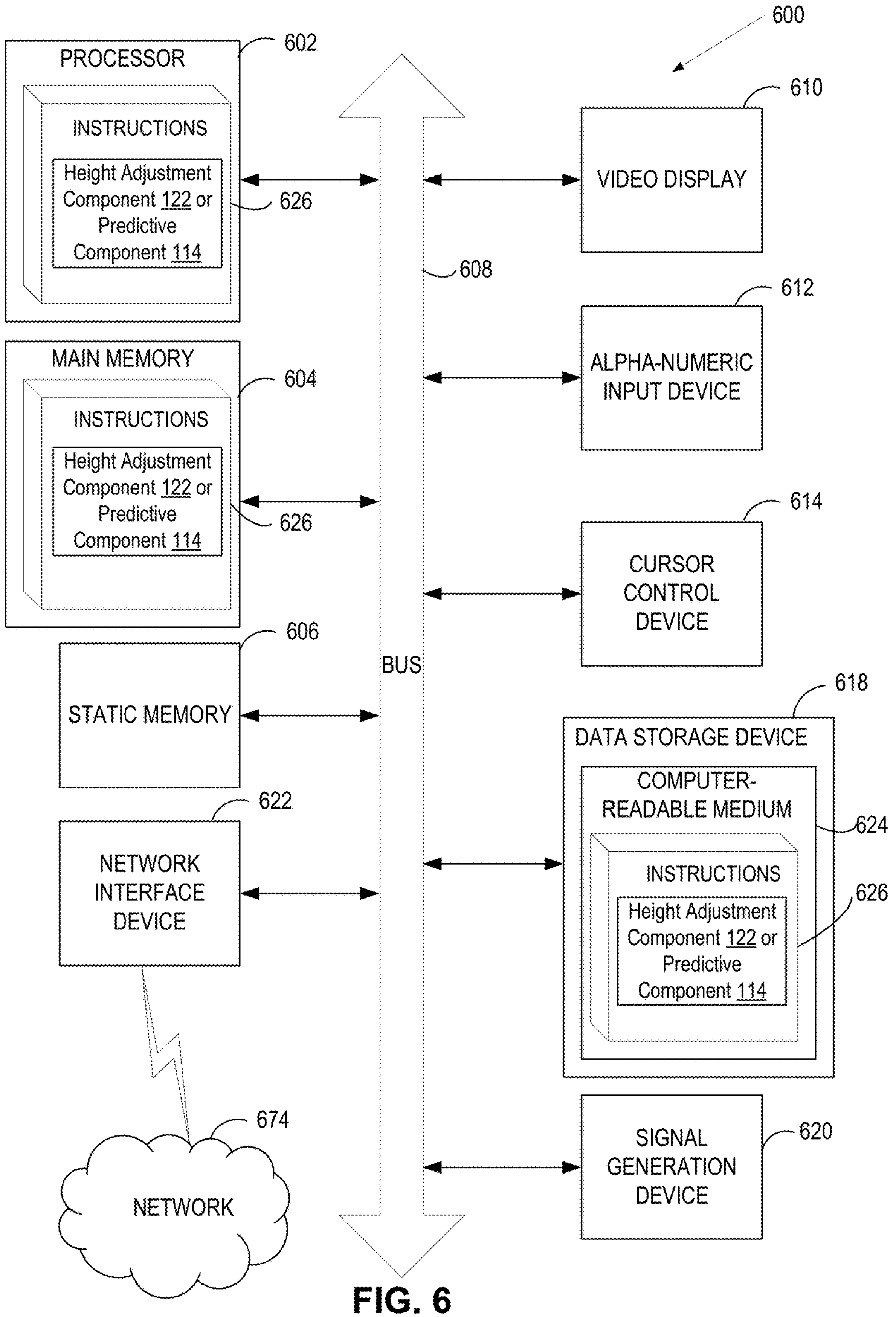
FIG. 6 is a block diagram illustrating a computer system, according to certain embodiments.

FIG. 6 is a block diagram illustrating a computer system 600, according to certain embodiments. In some embodiments, the computer system 600 is one or more of client device 120, predictive system 110, server machine 170, server machine 180, or predictive server 112.

In some embodiments, computer system 600 is connected (e.g., via a network, such as a Local Area Network (LAN), an intranet, an extranet, or the Internet) to other computer systems. In some embodiments, computer system 600 operates in the capacity of a server or a client computer in a client-server environment, or as a peer computer in a peer-to-peer or distributed network environment. In some embodiments, computer system 600 is provided by a personal computer (PC), a tablet PC, a Set-Top Box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 600 includes a processing device 602, a volatile memory 604 (e.g., Random Access Memory (RAM)), a non-volatile memory 606 (e.g., Read-Only Memory (ROM) or Electrically-Erasable Programmable ROM (EEPROM)), and a data storage device 616, which communicate with each other via a bus 608.

In some embodiments, processing device 602 is provided by one or more processors such as a general purpose processor (such as, for example, a Complex Instruction Set Computing (CISC) microprocessor, a Reduced Instruction Set Computing (RISC) microprocessor, a Very Long Instruction Word (VLIW) microprocessor, a microprocessor implementing other types of instruction sets, or a microprocessor implementing a combination of types of instruction sets) or a specialized processor (such as, for example, an Application Specific Integrated Circuit (ASIC), a Field Programmable Gate Array (FPGA), a Digital Signal Processor (DSP), or a network processor).

In some embodiments, computer system 600 further includes a network interface device 622 (e.g., coupled to network 674). In some embodiments, computer system 600 also includes a video display unit 610 (e.g., an LCD), an alphanumeric input device 612 (e.g., a keyboard), a cursor control device 614 (e.g., a mouse), and a signal generation device 620.

In some implementations, data storage device 616 includes a non-transitory computer-readable storage medium 624 on which store instructions 626 encoding any one or more of the methods or functions described herein, including instructions encoding components of FIG. 1 (e.g., height adjustment component 122, predictive component 114, etc.) and for implementing methods described herein (e.g., one or more of methods 500A-D).

In some embodiments, instructions 626 also reside, completely or partially, within volatile memory 604 and/or within processing device 602 during execution thereof by computer system 600, hence, in some embodiments, volatile memory 604 and processing device 602 also constitute machine-readable storage media.

While computer-readable storage medium 624 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

In some embodiments, the methods, components, and features described herein are implemented by discrete hardware components or are integrated in the functionality of other hardware components such as ASICs, FPGAs, DSPs or similar devices. In some embodiments, the methods, components, and features are implemented by firmware modules or functional circuitry within hardware devices. In some embodiments, the methods, components, and features are implemented in any combination of hardware devices and computer program components, or in computer programs.

Unless specifically stated otherwise, terms such as "identifying," "determining," "associating," "training," "causing," "receiving," "learning," "processing," "moving," "lifting," "lowering," "securing," "supporting," "heating," "contacting," "disposing," "identifying," "comprising,"

"using," "correcting," "configuring," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. In some embodiments, the terms "first," "second," "third," "fourth," etc. as used herein are meant as labels to distinguish among different elements and do not have an ordinal meaning according to their numerical designation.

Examples described herein also relate to an apparatus for performing the methods described herein. In some embodiments, this apparatus is specially constructed for performing the methods described herein, or includes a general purpose computer system selectively programmed by a computer program stored in the computer system. Such a computer program is stored in a computer-readable tangible storage medium.

The methods and illustrative examples described herein are not inherently related to any particular computer or other apparatus. In some embodiments, various general purpose systems are used in accordance with the teachings described herein. In some embodiments, a more specialized apparatus is constructed to perform methods described herein and/or each of their individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A susceptor comprising:

a plurality of substrate support subsections; and a vertical-movement component associated with a first substrate support subsection of the plurality of substrate support subsections, wherein the vertical-movement component is configured to vertically move at least a portion of the first substrate support subsection, wherein two or more of the plurality of substrate support subsections are at least one of different shapes or different sizes and are configured to independently move vertically to contact a lower surface of a substrate disposed on the susceptor.

2. The susceptor of claim 1, wherein the vertical-movement component comprises a rod or tube configured to lift and lower the first substrate support subsection.

3. The susceptor of claim 1, wherein the vertical-movement component comprises a piezoelectric component configured to lift and lower a mesa of the first substrate support subsection.

4. The susceptor of claim 1, wherein the susceptor is an electrostatic chuck, and wherein the first substrate support subsection comprises an electrode configured to secure the substrate to a corresponding upper surface of the first substrate support subsection.

5. The susceptor of claim 1, wherein the first substrate support subsection comprises a temperature adjustment component configured to heat or cool a portion of the substrate secured to a corresponding upper surface of the first substrate support subsection.

6. The susceptor of claim 1, wherein two or more of the plurality of substrate support subsections are configured to:

move up to contact the lower surface of the substrate disposed on the susceptor;

electrostatically secure to the lower surface of the substrate; and move down to correct bow of the substrate.

7. The susceptor of claim 1, wherein the plurality of substrate support subsections form a substantially continuous support surface configured to electrostatically secure the substrate to an upper surface of the susceptor.

8. A method comprising:

identifying sensor data;

determining, based on the sensor data, a plurality of offset data between a substrate and a susceptor, the susceptor comprising a plurality of substrate support subsections and a vertical-movement component associated with a first substrate support subsection of the plurality of substrate support subsections, wherein the vertical-movement component is configured to vertically move at least a portion of the first substrate support subsection; and causing, based on the offset data, actuation of at least the first substrate support subsection via at least the vertical-movement component, wherein two or more of the plurality of substrate support subsections are at least one of different shapes or different sizes and are configured to independently move vertically to contact a lower surface of the substrate disposed on the susceptor.

9. The method of claim 8, wherein the vertical-movement component comprises at least one of:

a rod or tube configured to lift and lower the first substrate support subsection; or a piezoelectric component configured to lift and lower a mesa of the first substrate support subsection.

10. The method of claim 8, wherein the susceptor is an electrostatic chuck, and wherein the first substrate support subsection comprises an electrode configured to secure the substrate to a corresponding upper surface of the first substrate support subsection.

11. The method of claim 8, wherein the first substrate support subsection comprises a temperature adjustment component configured to heat or cool a portion of the substrate secured to a corresponding upper surface of the first substrate support subsection.

12. The method of claim 8, wherein the causing of the actuation comprises causing the two or more of the plurality of substrate support subsections to independently move vertically to contact the lower surface of the substrate disposed on the susceptor.

13. The method of claim 8, wherein the causing of the actuation comprises causing two or more of the plurality of substrate support subsections to:

move up to contact the lower surface of the substrate disposed on the susceptor;

electrostatically secure to the lower surface of the substrate; and move down to correct bow of the substrate.

14. The method of claim 8, wherein the sensor data comprises one or more of image data, interferometer data, pressure data, or capacitance data.

15. The method of claim 8, wherein the determining of the plurality of offset data comprises:

providing the sensor data as input to a trained machine learning model; and receiving, from the trained machine learning model, output associated with the plurality of offset data, the trained machine learning model being trained using data input comprising historical sensor data and target output comprising historical offset data.

16. A system comprising:

a memory:

a processing device coupled to the memory, the processing device to:

identify sensor data;

determine, based on the sensor data, offset data associated with one or more distances between a substrate and a susceptor, the susceptor comprising a plurality of substrate support subsections and a vertical-movement component associated with a first substrate support subsection of the plurality of substrate support subsections, wherein the vertical-movement component is configured to vertically move at least a portion of the first substrate support subsection; and cause, based on the offset data, actuation of at least the first substrate support subsection via the vertical-movement component, wherein two or more of the plurality of substrate support subsections are at least one of different shapes or different sizes and are configured to independently move vertically to contact a lower surface of the substrate disposed on the susceptor.

17. The system of claim 16, wherein the vertical-movement component comprises at least one of:

a rod or tube configured to lift and lower the first substrate support subsection; or a piezoelectric component configured to lift and lower a mesa of the first substrate support subsection.

18. The system of claim 16, wherein one or more of:

the susceptor is an electrostatic chuck, the first substrate support subsection comprising an electrode configured to secure the substrate to a corresponding upper surface of the first substrate support subsection; or the first substrate support subsection comprises a temperature adjustment component configured to heat or cool a portion of the substrate secured to a respective upper surface of the first substrate support subsection.

19. The system of claim 16, wherein to cause the actuation, the processing device is to cause the two or more of the plurality of substrate support subsections to one or more of:

independently move vertically to contact the lower surface of the substrate disposed on the susceptor; or move up to contact the lower surface of the substrate disposed on the susceptor, electrostatically secure to the lower surface of the substrate, and move down to correct bow of the substrate.

20. The system of claim 16, wherein the sensor data comprises one or more of image data, interferometer data, pressure data, or capacitance data.

* * * * *